United States Patent
Chen et al.

(10) Patent No.: US 12,211,876 B2
(45) Date of Patent: Jan. 28, 2025

(54) EXTRA DOPED REGION FOR BACK-SIDE DEEP TRENCH ISOLATION

(71) Applicant: Taiwan Semiconductor Manufacturing Company, Ltd., Hsin-Chu (TW)

(72) Inventors: Chun-Yuan Chen, Tainan (TW); Ching-Chun Wang, Tainan (TW); Dun-Nian Yaung, Taipei (TW); Hsiao-Hui Tseng, Tainan (TW); Jhy-Jyi Sze, Hsin-Chu (TW); Shyh-Fann Ting, Tainan (TW); Tzu-Jui Wang, Fengshan (TW); Yen-Ting Chiang, Tainan (TW); Yu-Jen Wang, Kaohsiung (TW); Yuichiro Yamashita, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/336,100

(22) Filed: Jun. 16, 2023

(65) Prior Publication Data

US 2023/0335572 A1 Oct. 19, 2023

Related U.S. Application Data (60) Continuation of application No. 17/519,784, filed on Nov. 5, 2021, now Pat. No. 11,728,366, which is a
(Continued)

(51) Int. Cl.
*H01L 27/146* (2006.01)
(52) U.S. Cl.
CPC ...... *H01L 27/1463* (2013.01); *H01L 27/1464* (2013.01); *H01L 27/14643* (2013.01);
(Continued)

(58) Field of Classification Search
None
See application file for complete search history.

(56) References Cited

U.S. PATENT DOCUMENTS 9,160,953 B2 10/2015 Oishi
9,954,022 B2 4/2018 Chen et al.
(Continued)

FOREIGN PATENT DOCUMENTS

CN 1665031 A 9/2005

OTHER PUBLICATIONS

Tournier, et al. "Pixel-to-Pixel Isolation by Deep Trench Technology: Application to CMOS Image Sensor." International Image Sensor Workshop. Jun. 2011.
(Continued)

*Primary Examiner* — Hung K Vu
(74) *Attorney, Agent, or Firm* — Eschweiler & Potashnik, LLC (57) ABSTRACT

The present disclosure, in some embodiments, relates to an image sensor integrated chip. The image sensor integrated chip includes a semiconductor substrate having sidewalls that form one or more trenches. The one or more trenches are disposed along opposing sides of a photodiode and vertically extend from an upper surface of the semiconductor substrate to within the semiconductor substrate. A doped region is arranged along the upper surface of the semiconductor substrate and along opposing sides of the photodiode. A first dielectric lines the sidewalls of the semiconductor substrate and the upper surface of the semiconductor substrate. A second dielectric lines sidewalls and an upper surface of the first dielectric. The doped region has a width laterally between a side of the photodiode and a side of the first dielectric. The width of the doped region varies at different heights along the side of the photodiode.

20 Claims, 7 Drawing Sheets

Related U.S. Application Data continuation of application No. 16/674,216, filed on Nov. 5, 2019, now Pat. No. 11,227,889, which is a continuation of application No. 16/352,108, filed on Mar. 13, 2019, now Pat. No. 10,510,789, which is a division of application No. 15/919,784, filed on Mar. 13, 2018, now Pat. No. 10,276,618, which is a continuation of application No. 14/923,635, filed on Oct. 27, 2015, now Pat. No. 9,954,022.

(52) U.S. Cl.
CPC .. *H01L 27/14689* (2013.01); *H01L 27/14609* (2013.01); *H01L 27/14621* (2013.01); *H01L 27/14627* (2013.01)

(56) References Cited

U.S. PATENT DOCUMENTS

| | | | |
|---|---|---|---|
| 10,276,618 | B2 | 4/2019 | Chen et al. |
| 11,227,889 | B2 | 1/2022 | Chen et al. |
| 2005/0151218 | A1 | 7/2005 | Mouli |
| 2006/0006436 | A1 | 1/2006 | Mouli |
| 2007/0096176 | A1 | 5/2007 | Mouli |
| 2007/0125935 | A1 | 6/2007 | Yaung |
| 2011/0156186 | A1 | 6/2011 | Iida et al. |
| 2011/0186918 | A1 | 8/2011 | Sung |
| 2011/0266645 | A1 | 11/2011 | Chao |
| 2012/0012965 | A1 | 1/2012 | Maeda |
| 2012/0025199 | A1 | 2/2012 | Chen et al. |
| 2012/0133011 | A1 | 5/2012 | Ueno et al. |
| 2012/0217601 | A1 | 8/2012 | Miyanami |
| 2012/0217602 | A1* | 8/2012 | Enomoto .......... H01L 27/14623 257/E31.127 |
| 2013/0221410 | A1 | 8/2013 | Ahn |
| 2013/0237039 | A1 | 9/2013 | Sleight et al. |
| 2013/0285130 | A1 | 10/2013 | Ting et al. |
| 2013/0307040 | A1 | 11/2013 | Ahn et al. |
| 2013/0341746 | A1 | 12/2013 | Ting et al. |
| 2014/0016012 | A1 | 1/2014 | Oishi |
| 2014/0054662 | A1* | 2/2014 | Yanagita .......... H01L 27/14645 438/73 |
| 2015/0200223 | A1 | 7/2015 | Lee |
| 2015/0243694 | A1 | 8/2015 | Ihara |
| 2015/0270306 | A1 | 9/2015 | Haddad et al. |
| 2015/0311247 | A1 | 10/2015 | Chen et al. |

OTHER PUBLICATIONS

Non-Final Office Action dated Feb. 10, 2017 for U.S. Appl. No. 14/923,635.
Final Office Action dated Aug. 11, 2017 for U.S. Appl. No. 14/923,635.
Notice of Allowance dated Dec. 15, 2017 for U.S. Appl. No. 14/923,635.
Non-Final Office Action dated Aug. 9, 2018 for U.S. Appl. No. 15/919,784.
Notice of Allowance dated Jan. 23, 2019 for U.S. Appl. No. 15/919,784.
Non-Final Office Action dated Jun. 27, 2019 for U.S. Appl. No. 16/352,108.
Notice of Allowance dated Oct. 3, 2019 for U.S. Appl. No. 16/352,108.
Non-Final Office Action dated Sep. 23, 2020 for U.S. Appl. No. 16/674,216.
Final Office Action dated Mar. 17, 2021 for U.S. Appl. No. 16/674,216.
Non-Final Office Action dated May 27, 2021 for U.S. Appl. No. 16/674,216.
Notice of Allowance dated Sep. 9, 2021 for U.S. Appl. No. 16/674,216.
Non-Final Office Action dated Sep. 29, 2022 for U.S. Appl. No. 17/519,784.
Notice of Allowance dated Mar. 24, 2023 for U.S. Appl. No. 17/519,784.

\* cited by examiner

EXTRA DOPED REGION FOR BACK-SIDE DEEP TRENCH ISOLATION

REFERENCE TO RELATED APPLICATIONS

This Application is a Continuation of U.S. application Ser. No. 17/519,784, filed on Nov. 5, 2021, which is a Continuation of U.S. application Ser. No. 16/674,216, filed on Nov. 5, 2019 (now U.S. Pat. No. 11,227,889, issued on Jan. 18, 2022), which is a Continuation of U.S. application Ser. No. 16/352,108, filed on Mar. 13, 2019 (now U.S. Pat. No. 10,510,789, issued on Dec. 17, 2019), which is a Divisional of U.S. application Ser. No. 15/919,784, filed on Mar. 13, 2018 (now U.S. Pat. No. 10,276,618, issued on Apr. 30, 2019), which is a Continuation of U.S. application Ser. No. 14/923,635, filed on Oct. 27, 2015 (now U.S. Pat. No. 9,954,022, issued on Apr. 24, 2018). The contents of the above-referenced Patent Applications are hereby incorporated by reference in their entirety.

BACKGROUND

Digital cameras and optical imaging devices employ image sensors. Image sensors convert optical images to digital data that may be represented as digital images. An image sensor typically includes an array of pixel sensors, which are unit devices for the conversion of an optical image into electrical signals. Pixel sensors often manifest as charge-coupled devices (CCDs) or complementary metal oxide semiconductor (CMOS) devices. However, CMOS pixel sensors have recently received more attention. Relative to CCD pixel sensors, CMOS pixel sensors provide lower power consumption, smaller size, and faster data processing. Further, CMOS pixel sensors provide a direct digital output of data, and generally have a lower manufacturing cost compared with CCD pixel sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many portable electronic devices (e.g., cameras, cellular telephones, computers, etc.) include an image sensor for capturing images. One example of such an image sensor is a CMOS image sensor (CIS) including an array of active pixel sensors (APSs). Deep trench isolation (DTI) structures are often arranged between adjacent pixels of a CIS to isolate neighboring pixels. These DTI structures are formed by using an etch process to form a deep trench within the semiconductor substrate, which is then filled with an insulating material. In some applications, a functional layer is disposed over an upper surface of the semiconductor substrate prior to etching the deep trench. The functional layer can enhance the performance of the semiconductor device, but also comprises one or more potential contaminants for the substrate.

In some instances, the etch process used to form the deep trench dissociates these contaminants from the functional layer, and the dissociated contaminants then diffuse into the semiconductor substrate through sidewalls of the deep trench as the deep trench is being formed. These contaminants can degrade performance CIS by introducing interface defects near an edge of the DTI structure. The interface defects can lead to an increase in dark current and/or white pixel number. The increase in dark current causes charges to accumulate even when light is not impingent on the image sensors, thereby becoming a major source of noise that can degrade image quality of digital imaging devices.

The present disclosure relates to a CMOS image sensor comprising a doped region, arranged between deep trench isolation structures and an image sensing element, which is configured to reduce dark current and white pixel number, and an associated method of formation. In some embodiments, the CMOS image sensor has a pixel region disposed within a semiconductor substrate. The pixel region has an image sensing element configured to convert radiation into an electric signal. A plurality of back-side deep trench isolation (BDTI) structures extend into the semiconductor substrate on opposing sides of the pixel region. A doped region is laterally arranged between the BDTI structures and separates the image sensing element from the BDTI structures and the back-side of the semiconductor substrate. Separating the image sensing element from the BDTI structures prevents the image sensing element from interacting with interface defects near edges of the BDTI structures, and thereby effectively reduces dark current and improves white pixel number performance without any adverse side-effect.

Figure 1:
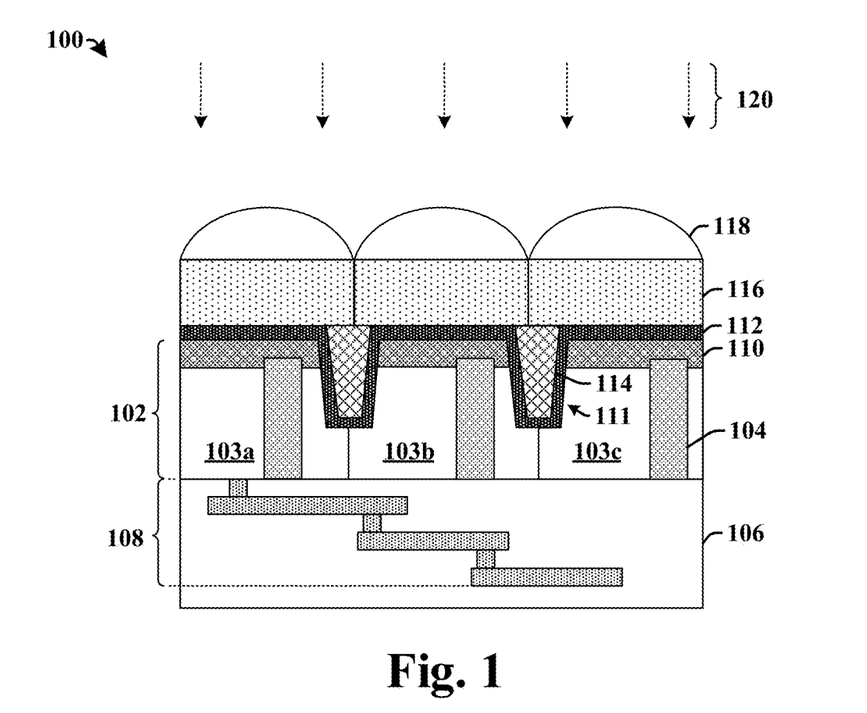
FIG. 1 illustrates a cross-sectional view of some embodiments of a CMOS (complementary metal-oxide-semiconductor) image sensor having a light sensing element separated from a deep trench isolation (DTI) structure by a doped region.

FIG. 1 illustrates a cross-sectional view of some embodiments of a CMOS (complementary metal-oxide-semiconductor) image sensor 100 having a light sensing element separated from a deep trench isolation (DTI) structure by a doped region.

The CMOS image sensor 100 comprises a semiconductor substrate 102 having a plurality of pixel regions 103a-103c. The plurality of pixel regions 103a-103c respectively comprise an image sensing element 104 configured to convert incident radiation 120 (e.g., photons) into an electric signal. In some embodiments, the image sensing element 104 may comprise a photodiode. In such embodiments, the photodiode may comprise a first region within the semiconductor substrate 102 having a first doping type (e.g., n-type doping) and an adjoining second region within the semiconductor substrate 102 having a second doping type (e.g., p-type doping) that is different than the first doping type. In some embodiments, the plurality of pixel regions 103a-103c may be arranged within the semiconductor substrate 102 in an array comprising rows and/or columns.

The pixel regions 103a-103c are isolated from adjacent pixel regions 103a-103c by deep trench isolation (DTI) structures 111 extending into the semiconductor substrate 102 and comprising one or more dielectric materials 112-114. In some embodiments, the one or more dielectric materials 112-114 may comprise a passivation layer 112 and a dielectric fill layer 114 (e.g., an oxide), for example. In some embodiments, the DTI structures 111 may comprise back-side deep trench isolation (BDTI) structures that vertically extend from a back-side of the semiconductor substrate 102 to a location within the semiconductor substrate 102. The back-side of the semiconductor substrate 102 opposes a back-end-of-the-line (BEOL) metallization stack comprising a plurality of metal interconnect layers 108 arranged within an ILD layer 106.

A plurality of color filters 116 are arranged over the back-side of the semiconductor substrate 102. The plurality of color filters 116 are respectively configured to transmit specific wavelengths of incident radiation 120. For example, a first color filter (e.g., a red color filter) may transmit light having wavelengths within a first range, while a second color filter may transmit light having wavelengths within a second range different than the first range. A plurality of micro-lenses 118 are arranged over the plurality of color filters 116. Respective micro-lenses 118 are aligned laterally with the color filters 116 and overlie the pixel regions 103a-103c. The micro-lenses 118 are configured to focus the incident radiation 120 (e.g., light) towards the pixel regions 103a-103c.

A doped region 110 is arranged along a surface of the pixel regions 103a-103c opposing at a location that is between the pixel regions 103a-103c and the plurality of color filters 116. The doped region 110 separates the image sensing elements 104 within the pixel regions 103a-103c from the DTI structures 111. The doped region 110 has a greater concentration of dopants than the pixel region 103a-103c. In some embodiments, the doped region 110 may comprise a p-type region, while in other embodiments the doped region 110 may comprise an n-type region. The greater doping concentration of the doped region 110 forms a region that separates the image sensing element 104 from interface defects located along the edges of the DTI structures 111, and thereby reduces the dark current and/or white pixel number of the CMOS image sensor 100.

Figure 2:
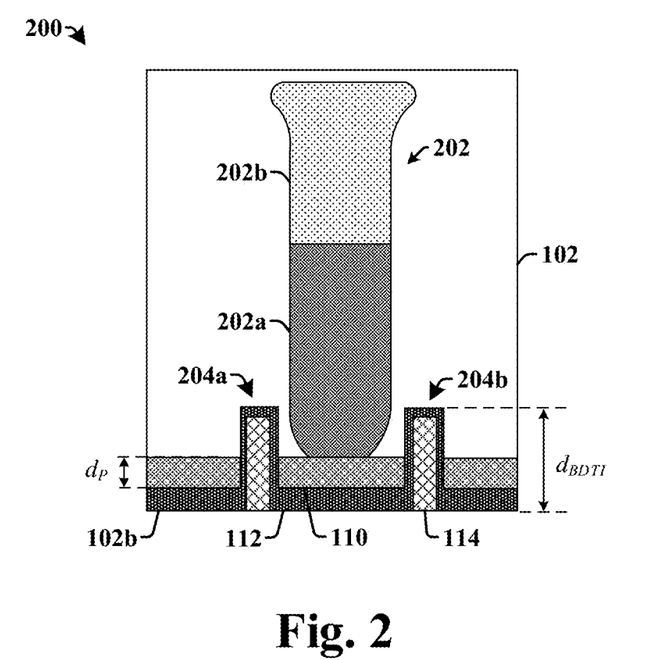
FIG. 2 illustrates a cross-sectional view of some embodiments of an integrated chip comprising a photodiode separated from a back-side deep trench isolation (BDTI) structure by a doped region.

FIG. 2 illustrates a cross-sectional view of some embodiments of an integrated chip 200 comprising a photodiode 202 separated from a back-side deep trench isolation (BDTI) structure by a doped region.

The photodiode 202 comprises a first region 202a and an underlying second region 202b arranged within the semiconductor substrate 102. The first region 202a has a first doping type and the second region 202b has a second doping type that is different than the first doping type. In some embodiments, the first region 202a comprises an n-type region and the second region 202b comprises a p-type region.

A plurality of BDTI structures 204a-204b are arranged within a back-side 102b of the semiconductor substrate 102 and extend from the back-side 102b of the semiconductor substrate 102 to a position laterally separated from the photodiode 202. The plurality of BDTI structures comprise one or more dielectric materials 112-114 arranged within a trench in the semiconductor substrate 102. In various embodiments, the plurality of BDTI structures 204a-204b may extend to a depth $d_{BDTI}$ of greater than or equal to approximately 0.5 microns within the semiconductor substrate 102.

A doped region 110 is vertically arranged between the photodiode 202 and the back-side 102b of the semiconductor substrate 102. The doped region 110 has an opposite doping type as the first region 202a of the photodiode 202 so that the doped region 110 separates the photodiode 202 from the plurality of BDTI structures 204a-204b. For example, in some embodiments, the first region 202a may comprise an n-type doping, while the doped region 110 may comprise a p-type region. In other embodiments, the first region 202a may comprise a p-type doping, while the doped region 110 may comprise an n-type region.

The photodiode 202 may vertically extend to a position that abuts the doped region 110. In some embodiments, the doped region 110 may be arranged along sidewalls of the photodiode 202, so that the doped region 110 laterally separates the first region 202a of the photodiode 202 from the plurality of BDTI structures 204a-204b and vertically separates the first region 202a from one or more dielectric materials 112-114 overlying the back-side 102b of the semiconductor substrate 102. The doped region 110 laterally extends between sidewalls of the plurality of BDTI structures 204a-204b. For example, the doped region 110 laterally extends from a sidewall of a first BDTI structure 204a to a sidewall of a second BDTI structure 204b.

In some embodiments, the doped region 110 may have a doping concentration that is greater than or equal to approximately $5e15$ dopants/cm$^3$. In some additional embodiments, the doped region 110 may have a doping concentration that is greater than or equal to approximately $1e17$ dopants/cm$^3$. The doped region 110 has a depth $d_P$ that is less than the depth $d_{BDTI}$ of the plurality of BDTI structures 204a-204b, such that the plurality of BDTI structures 204a-204b vertically extend through the doped region 110. For example, in various embodiments, the doped region 110 may extend to a depth $d_P$ of greater than or equal to approximately 0.1 microns within the semiconductor substrate 102.

Figure 3:
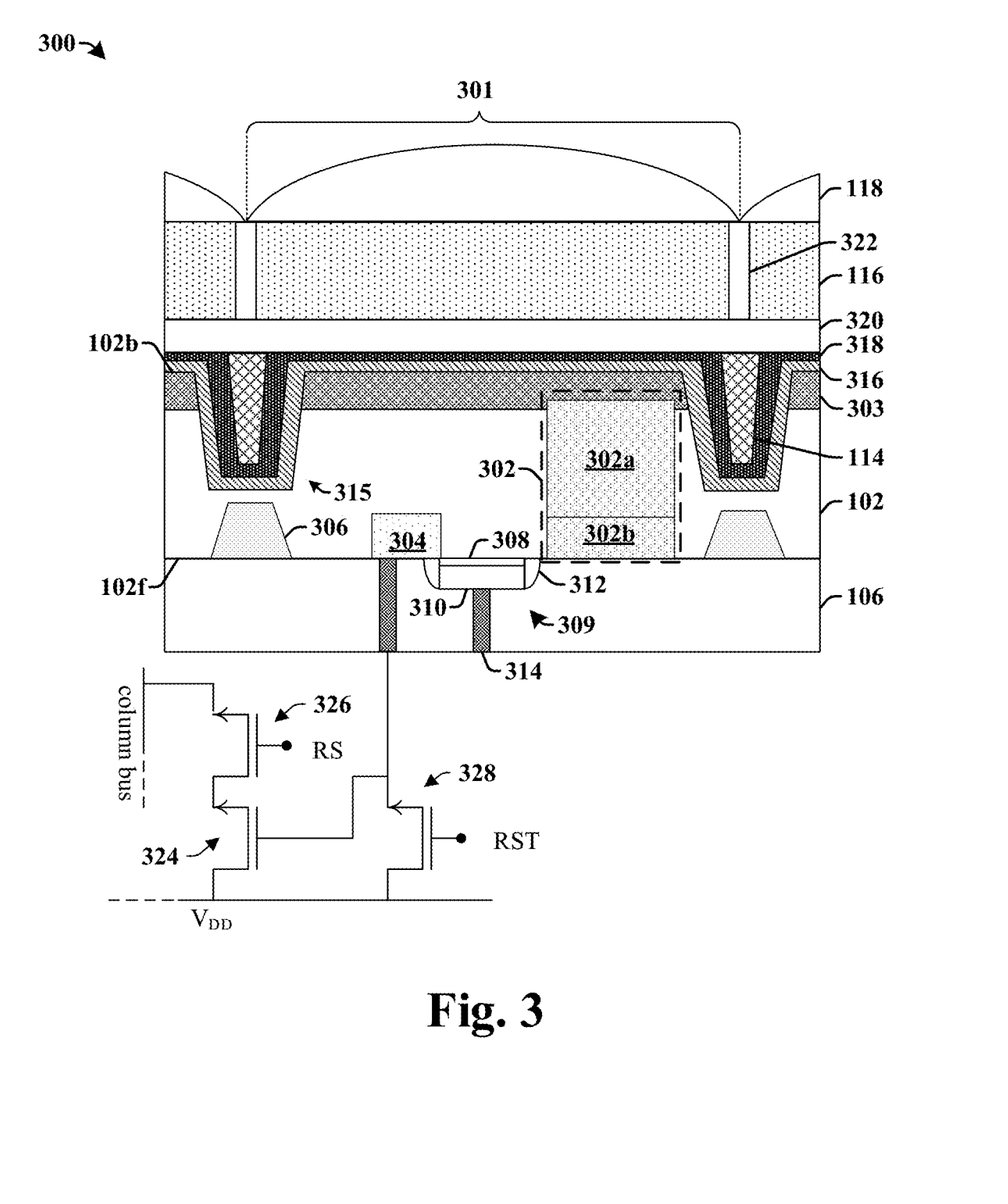
FIG. 3 illustrates a cross-sectional view of some additional embodiments of a BSI-CMOS image sensor comprising a photodiode separated from a BDTI structure by a p-type doped region.

FIG. 3 illustrate cross-sectional views of some additional embodiments of a back-side illumination CMOS (BSI- CMOS) image sensor 300 comprising a photodiode separated from a back-side deep trench isolation (BDTI) structure by a p-type doped region.

The BSI-CMOS image sensor 300 comprises a pixel region 301 arranged within a semiconductor substrate 102. In some embodiments, the pixel region 301 may be isolated from adjacent pixel regions by one or more isolation structures 306 (e.g., shallow trench isolation regions) arranged within the semiconductor substrate 102 on opposing sides of the pixel region 301. The one or more isolation structures 306 may comprise an insulating material arranged within a trench in a front-side 102*f* of the semiconductor substrate 102.

The pixel region 301 comprises a photodiode 302 having a first region 302*a* with a first doping type (e.g., n-type doping) and a second region 302*b* with a second doping type (e.g., p-type doping) that is different than the first doping type. The first region 302*a* vertically extends from the second region 302*b* to a p-type region 303. In some embodiments, the p-type region 303 may have a doping concentration greater than or equal to approximately 5e15 atoms/cm$^3$. In some embodiments, the p-type region 303 may be arranged along a back-side 102*b* of the semiconductor substrate 102.

A transfer transistor 309 is arranged over the front-side 102*f* of the semiconductor substrate 102. The transfer transistor 309 comprises a gate dielectric layer 308 is disposed over the front-side of the semiconductor substrate 102 and a gate electrode 310 is arranged onto the gate dielectric layer 308. In some embodiments, sidewall spacers 312 are arranged on opposing sides of the gate electrode 310. The transfer transistor 309 is laterally arranged between the photodiode 302 and a floating diffusion well 304.

An ILD layer 106 is arranged along the front-side 102*f* of the semiconductor substrate 102. The ILD layer 106 comprises one or more ILD materials. In various embodiments, the ILD layer 106 may comprise one or more of a low-k dielectric layer (i.e., a dielectric with a dielectric constant less than about 3.9), an ultra low-k dielectric layer, or an oxide (e.g., silicon oxide). Conductive contacts 314 are arranged within the ILD layer 106. The conductive contacts 314 extend from the gate electrode 310 and the floating diffusion well 304 to one or more metal wire layers (not shown). In various embodiments, the conductive contacts 314 may comprise a conductive metal such as copper or tungsten, for example.

Back-side deep trench isolation (BDTI) structures 315 are arranged within the back-side 102*b* of the semiconductor substrate 102 along edges of the pixel region 301. The plurality of BDTI structures 315 may comprise a passivation layer 316 arranged onto sidewalls of a trench extending into the back-side 102*b* of the semiconductor substrate 102. A high-k dielectric layer 318 vertically and laterally separates the passivation layer 316 from a dielectric fill layer 114 that fills in a remainder of the trench. In some embodiments, the passivation layer 316 and the high-k dielectric layer 318 may extend over the back-side 102*b* of the semiconductor substrate 102 between a first trench and the second trench. In some embodiments, the passivation layer 316 may comprise an anti-reflective coating (ARC), such as a bottom resist anti-reflective coating (BARC), for example. In other embodiments, the passivation layer 316 may comprise an organic polymer or a metallic oxide. In some embodiments, the high-k dielectric layer 318 may comprise hafnium oxide (HfO), hafnium silicon oxide (HfSiO), hafnium aluminum oxide (HfAlO), or hafnium tantalum oxide (HMO), for example.

A layer of dielectric material 320 vertically separates a plurality of color filters 116 from the back-side 102*b* of the semiconductor substrate 102. In some embodiments, the plurality of color filters 116 may be arranged within a grid structure 322 disposed onto the layer of dielectric material 320. In some embodiments, the grid structure 322 may comprise a stacked grid having a metal framework surrounded by a dielectric material. In some embodiments, layer of dielectric material 320 and the stacked grid may have a same dielectric material (e.g., silicon-dioxide (SiO$_2$)).

A plurality of micro-lenses 118 are arranged over the plurality of color filters 116. In some embodiments, the plurality of micro-lenses 118 have a substantially flat bottom surface abutting the plurality of color filters 116 and a curved upper surface. The curved upper surface is configured to focus incident radiation towards the underlying pixel region 301.

During operation of the BSI-CMOS image sensor 300 incident radiation is focused by the micro-lens 118 to the underlying pixel region 301. When incident radiation of sufficient energy strikes the photodiode 302, it generates an electron-hole pair that produces a photocurrent. The transfer transistor 309 controls charge transfer from the photodiode 302 to the floating diffusion well 304. If the charge level is sufficiently high within the floating diffusion well 304, a source follower transistor 324 is activated and charges are selectively output according to operation of a row select transistor 326 used for addressing. A reset transistor 328 is configured to reset the photodiode 302 between exposure periods.

FIGS. 4-11 illustrate some embodiments of cross-sectional views 400-1100 showing a method of forming a CMOS-BSI image sensor having doped region separating a photodiode from a back-side deep trench isolation (BDTI) structure.

Figure 4:
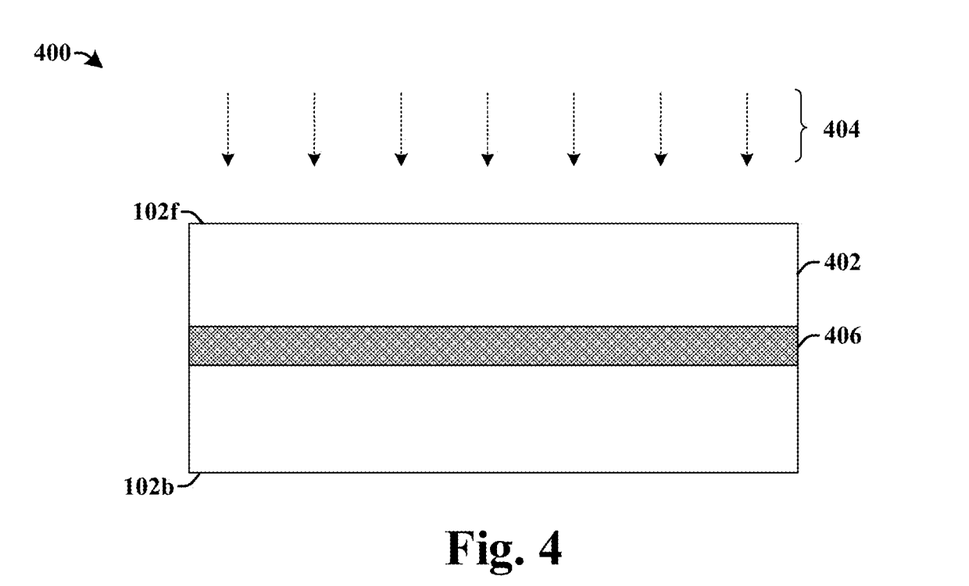
FIGS. 4-11 illustrate some embodiments of cross-sectional views showing a method of forming a CMOS-BSI image sensor having a doped region separating a photodiode and a BDTI structure.

As shown in cross-sectional view 400 of FIG. 4, a dopant species 404 is implanted into a semiconductor substrate 402 to form a doped region 406. In various embodiments, the semiconductor substrate 402 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, the dopant species 404 may comprise a p-type dopant (e.g., boron) that is implanted into a front-side 402*f* of the semiconductor substrate 402. In other embodiments, the dopant species 404 may comprise an n-type dopant (e.g., phosphorous). In some embodiments, the dopant species 404 may be implanted into the back-side 402*b* of the semiconductor substrate 402. In some embodiments, the dopant species 404 may be implanted as a blanket implantation (i.e., an unmasked implantation). In other embodiments, the dopant species 404 may be implanted as a selective implantation (i.e., a masked implantation).

Figure 5:
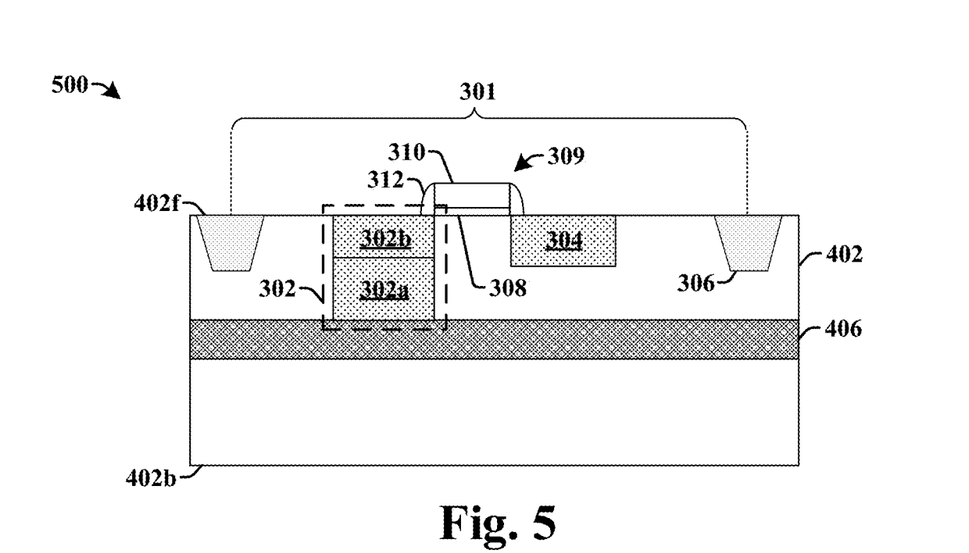

As shown in cross-sectional view 500 of FIG. 5, a transfer transistor 309 is formed over a front-side 402*f* of the semiconductor substrate 402. The transfer transistor 309 may be formed by depositing a gate dielectric film and a gate electrode film over the semiconductor substrate 402. The gate dielectric film and the gate electrode film are subsequently patterned to form a gate dielectric layer 308 and a gate electrode 310. Sidewall spacers 312 may be formed on the outer sidewalls of the gate electrode 310. In some embodiments, the sidewall spacers 312 may be formed by depositing nitride onto the front-side 402*f* of the semiconductor substrate 402 and selectively etching the nitride to form the sidewall spacers 312.

Implantation processes are performed within the front-side 402f of the semiconductor substrate 402 to form a photodiode 302 along a first side of the transfer transistor 309 and a floating diffusion well 304 along an opposite, second side of the transfer transistor 309. The photodiode 302 may be formed by selectively implanting the semiconductor substrate 102 with a first implantation process to form a first region 302a having a first doping type (e.g., n-type), and a second subsequent implantation process to form an abutting second region 302b having a second doping type (e.g., p-type) different than the first doping type. In some embodiments, the first region 302a may vertically abut the doped region 406. In some embodiments, the semiconductor substrate 402 may be selectively implanted according to a patterned masking layer (not shown) comprising photoresist.

In some embodiments, one or more isolation structures 306 (e.g., shallow trench isolation regions) may be formed within the front-side 402f of the semiconductor substrate 402 on opposing sides of a pixel region 301. The one or more isolation structures 306 may be formed by selectively etching the front-side 402f of the semiconductor substrate 402 to form shallow-trenches and subsequently forming an oxide within the shallow-trenches. In some embodiments, the one or more isolation structures 306 may be formed prior to formation of the transfer transistor 309, the photodiode 302, and/or the floating diffusion well 304.

Figure 6:
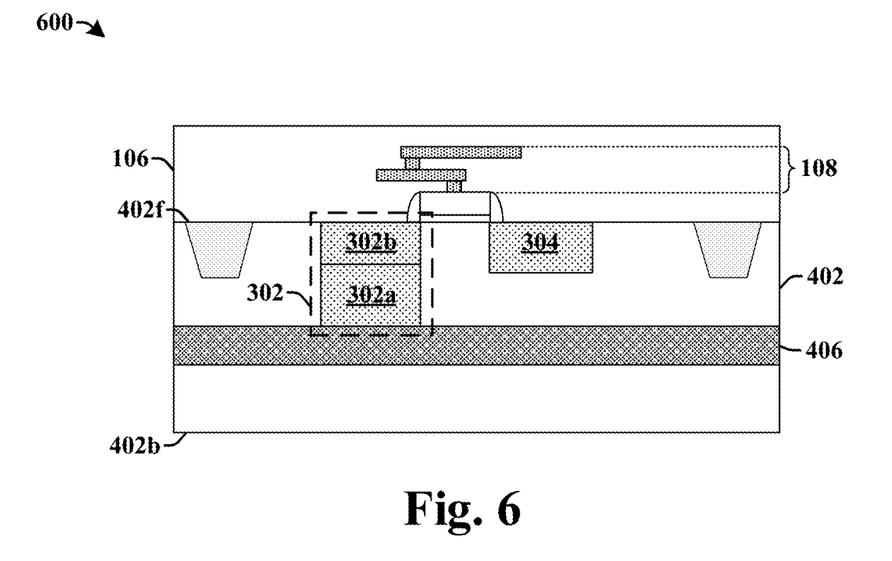

As shown in cross-sectional view 600 of FIG. 6, a BEOL metallization stack comprising a plurality of metal interconnect layers 108 arranged within an ILD layer 106 is formed over the front-side 402f of the semiconductor substrate 402. In some embodiments, the BEOL metallization stack may be formed by forming the ILD layer 106, which comprises one or more layers of ILD material, over the front-side 402f of the semiconductor substrate 402. The ILD layer 106 is subsequently etched to form via holes and/or metal trenches. The via holes and/or metal trenches are then filled with a conductive material to form the plurality of metal interconnect layers 108. In some embodiments, the ILD layer 106 may be deposited by a physical vapor deposition technique (e.g., PVD, CVD, etc.). The plurality of metal interconnect layers 108 may be formed using a deposition process and/or a plating process (e.g., electroplating, electro-less plating, etc.). In various embodiments, the plurality of metal interconnect layers 108 may comprise tungsten, copper, or aluminum copper, for example.

Figure 7:
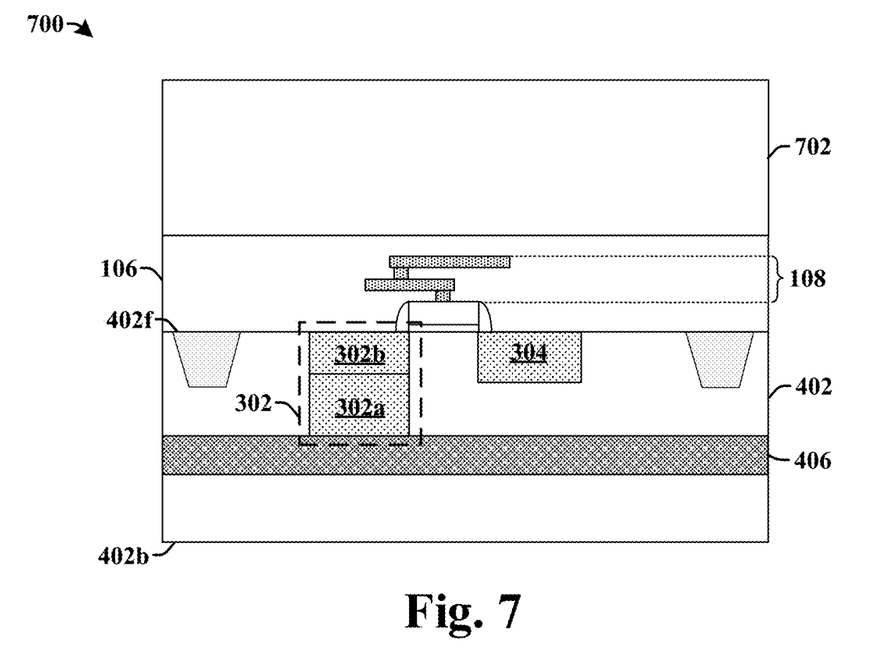

As shown in cross-sectional view 700 of FIG. 7, the ILD layer 106 is bonded to a handle substrate 702. In some embodiments, the bonding process may use an intermediate bonding oxide layer (not shown) arranged between the ILD layer 106 and the handle substrate 702. In some embodiments, the bonding process may comprise a fusion bonding process. In some embodiments, the handle substrate 702 may comprise a silicon wafer.

Figure 8:
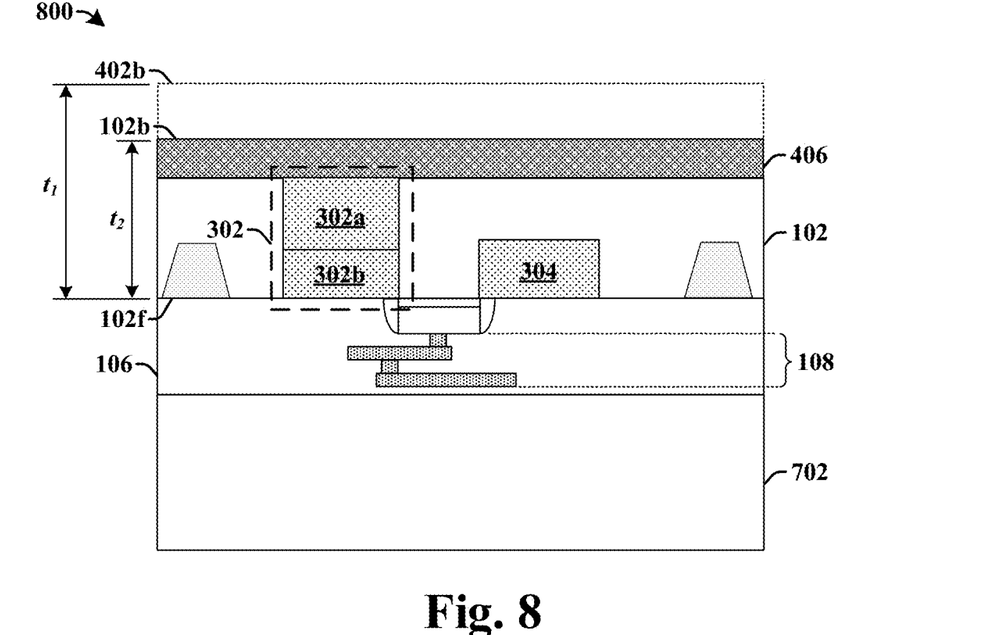

As shown in cross-sectional view 800 of FIG. 8, a thickness of the semiconductor substrate 102 is reduced. Thinning the semiconductor substrate 102 reduces a thickness of the substrate from a first thickness $t_1$ to a second thickness $t_2$ to allow for radiation to pass through the back-side 102b of the semiconductor substrate 102 to the photodiode 302. In some embodiments, the semiconductor substrate 102 may be thinned by etching the back-side 402b of the semiconductor substrate. In other embodiments, the semiconductor substrate 102 may be thinned by mechanical grinding the back-side 402b of the semiconductor substrate.

Figure 9:
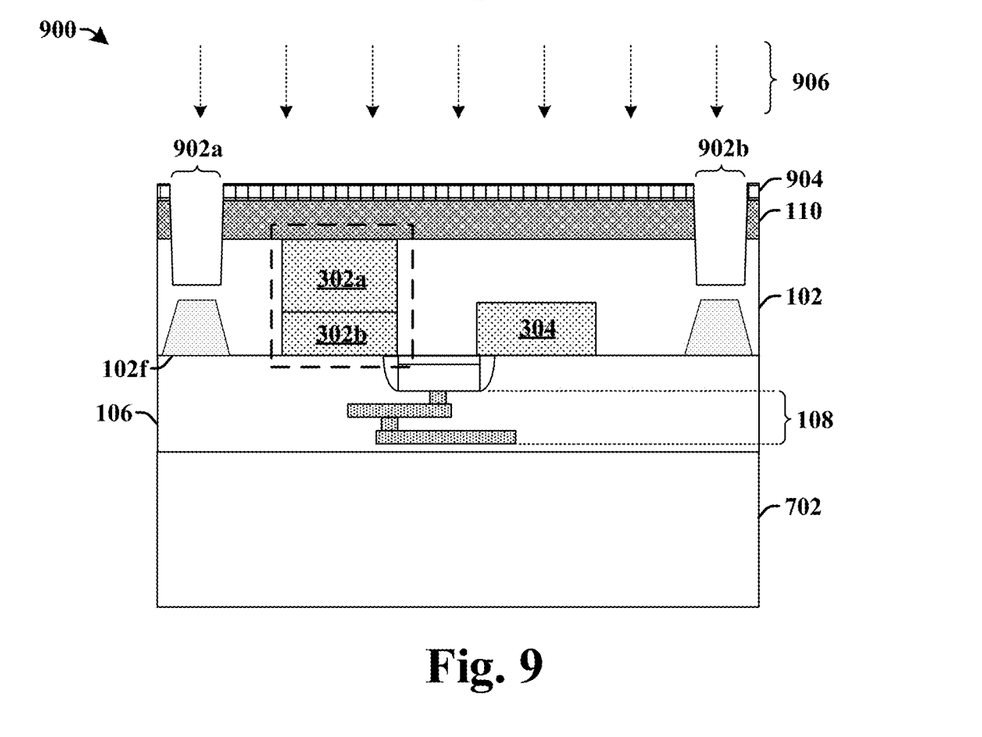

As shown in cross-sectional view 900 of FIG. 9, the semiconductor substrate 102 is selectively etched to form deep trenches 902a-902b within the back-side 102b of the semiconductor substrate 102. In some embodiments, the semiconductor substrate 102 may be etched by forming a masking layer 904 onto the back-side 102b of the semiconductor substrate 102. The semiconductor substrate 102 is then exposed to an etchant 906 in regions not covered by the masking layer 904. The etchant 906 etches the semiconductor substrate 102 to form deep trenches 902a-902b extending to the semiconductor substrate 102. The deep trenches 902a-902b extend through the doped region 110 to a position within the semiconductor substrate 102 that is laterally separated from the photodiode 302 by the doped region 110.

In various embodiments, the masking layer 904 may comprise photoresist or a nitride (e.g., SiN) patterned using a photolithography process. In various embodiments, the etchant 906 may comprise a dry etchant have an etching chemistry comprising a fluorine species (e.g., $CF_4$, $CHF_3$, $C_4F_8$, etc.) or a wet etchant (e.g., hydrofluoric acid (HF) or Tetramethylammonium hydroxide (TMAH)).

Figure 10:
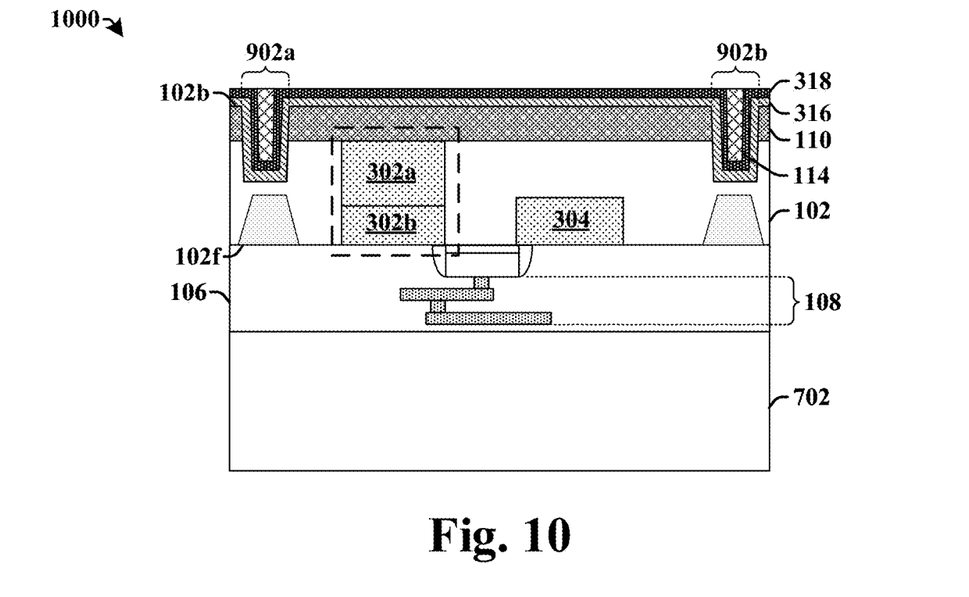

As shown in cross-sectional view 1000 of FIG. 10, the deep trenches 902a-902b are filled with dielectric material. In some embodiments, a passivation layer 316 is formed within the deep trenches 902a-902b and a high-k dielectric layer 318 is formed within the deep trenches 902a-902b onto the passivation layer 316. The passivation layer 316 and the high-k dielectric layer 318 line sidewalls and bottom surfaces of the deep trenches 902a-902b. In some embodiments, the passivation layer 316 and the high-k dielectric layer 318 may extend over the back-side 102b of the semiconductor substrate 102 between a first deep trench 902a and a second deep trench 902b. A dielectric fill layer 114 is formed to fill a remainder of the deep trenches 902a-902b. In some embodiments, a planarization process is performed after forming the dielectric fill layer 114 to form a planar surface that extends along an upper surface of the high-k dielectric layer 318 and the dielectric fill layer 114. In some embodiments, the passivation layer 316, the high-k dielectric layer 318, and the dielectric fill layer 114 may be deposited using a physical vapor deposition technique.

Figure 11:
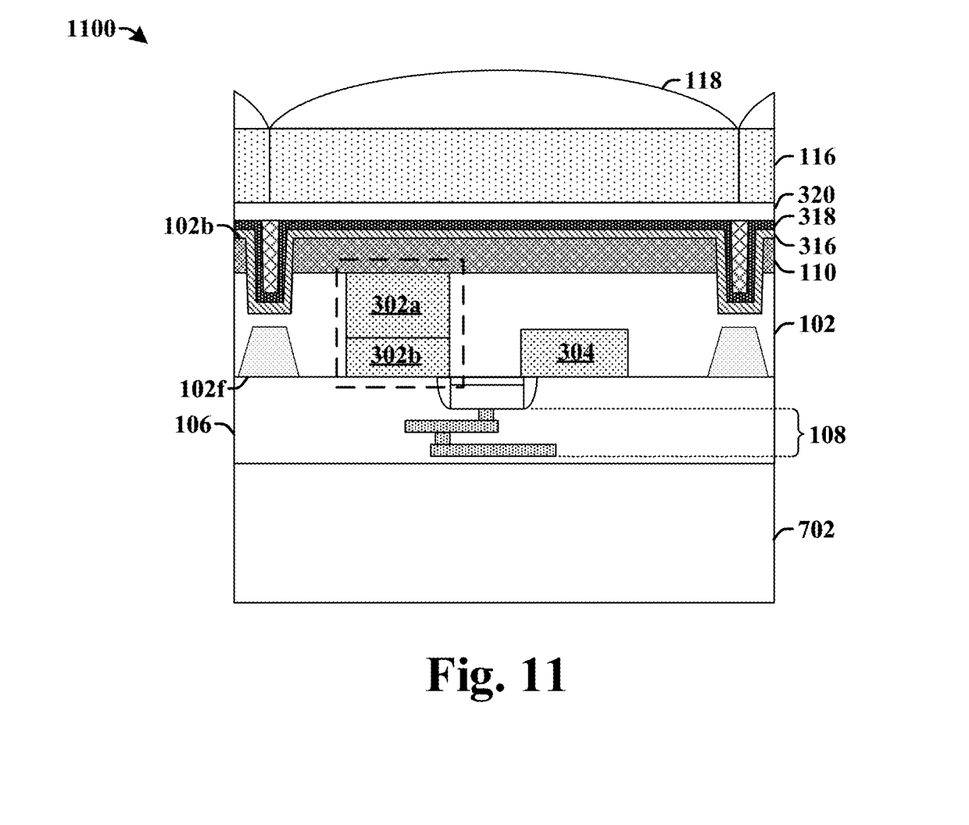

As shown in cross-sectional view 1100 of FIG. 11, a plurality of color filters 116 are formed over the back-side 102b of the semiconductor substrate 102. In some embodiments, the plurality of color filters 116 may be formed by forming a color filter layer and patterning the color filter layer. The color filter layer is formed of a material that allows for the transmission of radiation (e.g., light) having a specific range of wavelength, while blocking light of wavelengths outside of the specified range. Further, in some embodiments, the color filter layer is planarized subsequent to formation.

A plurality of micro-lenses 118 are formed over the plurality of color filters 116. In some embodiments, the plurality of micro-lenses 118 may be formed by depositing a micro-lens material above the plurality of color filters 116 (e.g., by a spin-on method or a deposition process). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The plurality of micro-lenses 118 are then formed by selectively etching the micro-lens material according to the micro-lens template.

Figure 12:
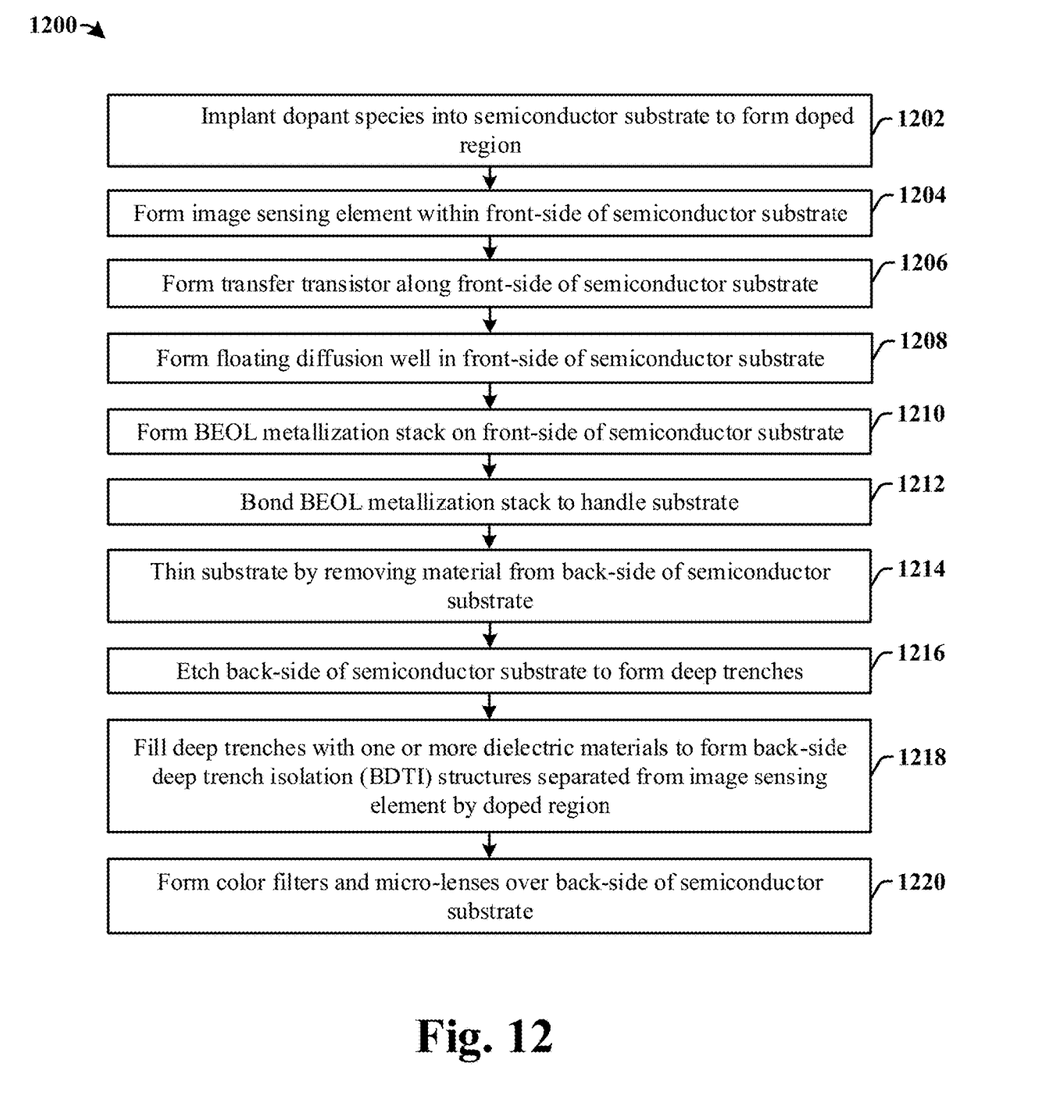
FIG. 12 illustrates a flow diagram of some embodiments of a method of forming a CMOS-BSI image sensor having a doped region separating an image sensing element from a BDTI structure.

FIG. 12 illustrates a flow diagram of some additional embodiments of a method 1200 of forming a CMOS-BSI image sensor having a light sensing element separated from back-side deep trench isolation (BDTI) regions by a p-type region.

While disclosed method 1200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases At 1202, a dopant species is implanted into a semiconductor substrate to form a doped region. In some embodiments, the implantation is performed into a front-side of the semiconductor substrate. In alternative embodiments, the implantation may be performed into a back-side of the semiconductor substrate. In some embodiments, the dopant species may comprise a p-type dopant. FIG. 4 illustrates a cross-sectional view corresponding to some embodiments corresponding to act 1202.

At 1204, an image sensing element is formed within the front-side of the semiconductor substrate. In some embodiments, the image sensing element may comprise a photodiode formed by implanting dopant species into the front-side of the semiconductor substrate. FIG. 5 illustrates a cross-sectional view corresponding to some embodiments corresponding to act 1204.

At 1206, a transfer transistor is formed along the front-side of the semiconductor substrate. FIG. 5 illustrates a cross-sectional view corresponding to some embodiments corresponding to act 1206.

At 1208, a floating diffusion well is formed within the front-side of the semiconductor substrate. FIG. 5 illustrates a cross-sectional view corresponding to some embodiments corresponding to act 1208.

At 1210, a BEOL metallization stack is formed over the transfer transistor on the front-side of the semiconductor substrate. FIG. 6 illustrates a cross-sectional view corresponding to some embodiments corresponding to act 1210.

At 1212, the BEOL metallization stack is bonded to a handle substrate. FIG. 7 illustrates a cross-sectional view corresponding to some embodiments corresponding to act 1212.

At 1214, the semiconductor substrate is thinned by removing material from a back-side of the semiconductor substrate. FIG. 8 illustrates a cross-sectional view corresponding to some embodiments corresponding to act 1214.

At 1216, the back-side of the semiconductor substrate is selectively etched to form deep trenches extending into the semiconductor substrate. FIG. 9 illustrates a cross-sectional view corresponding to some embodiments corresponding to act 1216.

At 1218, the deep trenches are filled with one or more dielectric materials to form back-side deep trench isolation (BDTI) structures separated from the image sensing element by the doped region. FIG. 10 illustrates a cross-sectional view corresponding to some embodiments corresponding to act 1218.

At 1220, color filters and micro-lenses are formed over the back-side of the semiconductor substrate. FIG. 11 illustrates a cross-sectional view corresponding to some embodiments corresponding to act 1220.

Therefore, the present disclosure relates to a CMOS image sensor comprising a doped region, arranged between deep trench isolation structures and an image sensing element, which is configured to reduce dark current and white pixel number, and an associated method of formation.

In some embodiments, the present disclosure relates to a CMOS image sensor. The image sensor comprises a pixel region disposed within a semiconductor substrate and comprising an image sensing element configured to convert radiation into an electrical signal. The image sensor further comprises a plurality of back-side deep trench isolation (BDTI) structures extending from a back-side of the semiconductor substrate to positions within the semiconductor substrate located on opposing sides of the pixel region. The image sensor further comprises a doped region laterally arranged between the plurality of BDTI structures and configured to separate the image sensing element from the plurality of BDTI structures.

In some embodiments, the present disclosure relates to a CMOS image sensor. The image sensor comprises a photodiode arranged within a semiconductor substrate, and a plurality of back-side deep trench isolation (BDTI) structures extending from a back-side of the semiconductor substrate to positions within the semiconductor substrate on opposing sides of the photodiode. The image sensor further comprises a doped region arranged along the back-side of the semiconductor substrate and configured to separate the photodiode from the plurality of BDTI structures. The image sensor further comprises a back-end-of-the-line (BEOL) metallization stack arranged on a front-side of the semiconductor substrate and comprising a plurality of metal interconnect layers arranged within an inter-level dielectric layer.

In yet other embodiments, the present disclosure relates to method of forming an image sensor. The method comprises implanting a dopant species into a semiconductor substrate to form a doped region, and forming an image sensing element within a front-side of the semiconductor substrate. The method further comprises etching the semiconductor substrate to form a plurality of deep trenches extending into a back-side of the semiconductor substrate, wherein the back-side of the semiconductor substrate opposes the front-side of the semiconductor substrate. The method further comprises filling the plurality of deep trenches with one or more dielectric materials to form back-side deep trench isolation (BDTI) structures that are separated from the image sensing element by the doped region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor integrated chip, comprising:
   a semiconductor substrate;
   wherein the semiconductor substrate has sidewalls that form one or more trenches, wherein the one or more trenches are disposed along opposing outermost sides of a photodiode and vertically extend from an upper surface of the semiconductor substrate to within the semiconductor substrate, the one or more trenches being laterally separated by a non-zero distance from one of the opposing outermost sides that faces the one or more trenches;
a doped region arranged along the upper surface of the semiconductor substrate and along the opposing outermost sides of the photodiode, wherein the doped region has a lower horizontally extending edge that is laterally outside of the photodiode and vertically above a minimum lateral width of the photodiode;
a first dielectric lining the sidewalls of the semiconductor substrate and the upper surface of the semiconductor substrate;
a second dielectric lining sidewalls and an upper surface of the first dielectric; and
wherein the doped region has a width laterally between a side of the photodiode and a side of the first dielectric, the width of the doped region varying at different heights below a top of the photodiode.

2. The image sensor integrated chip of claim 1, wherein the second dielectric is within a central region of the one or more trenches.

3. The image sensor integrated chip of claim 1, wherein the photodiode has a maximum lateral width below a lower surface of the first dielectric.

4. The image sensor integrated chip of claim 1, wherein the first dielectric and the second dielectric continuously extend from the upper surface of the semiconductor substrate to below the lower horizontally extending edge of the doped region.

5. The image sensor integrated chip of claim 1, wherein the doped region comprises an upper horizontally extending edge that is over the photodiode.

6. The image sensor integrated chip of claim 1, wherein the doped region has a smaller height directly above the photodiode than laterally between the photodiode and the one or more trenches.

7. The image sensor integrated chip of claim 1, wherein the doped region continuously extends past opposing outermost edges of the top of the photodiode.

8. An image sensor integrated chip, comprising:
a semiconductor substrate having sidewalls that form one or more trenches vertically extending from a first surface of the semiconductor substrate to within the semiconductor substrate;
a photodiode having a first doped photodiode region and a second doped photodiode region, the first doped photodiode region being vertically between the first surface and the second doped photodiode region;
a doped region arranged along the first surface of the semiconductor substrate and along the sidewalls of the semiconductor substrate;
a first dielectric lining the sidewalls and the first surface of the semiconductor substrate, wherein the first dielectric comprises a first sidewall and a second sidewall;
a second dielectric lining interior sidewalls and a horizontally extending surface of the first dielectric;
wherein a first outer edge of the second doped photodiode region, which faces the first sidewall of the first dielectric, is laterally separated from the first sidewall of the first dielectric by a first non-zero distance;
wherein a second outer edge of the second doped photodiode region, which faces the second sidewall of the first dielectric, is laterally separated from the second sidewall of the first dielectric by a second non-zero distance; and
wherein the first non-zero distance is greater than the second non-zero distance.

9. The image sensor integrated chip of claim 8, wherein the second dielectric continuously extends between interior sidewalls of the first dielectric.

10. The image sensor integrated chip of claim 8, wherein the first doped photodiode region has a first doping type and the second doped photodiode region has a second doping type that is different than the first doping type.

11. The image sensor integrated chip of claim 8, wherein the doped region has a horizontally extending edge that continuously extends past a side of the photodiode.

12. The image sensor integrated chip of claim 8, wherein an interface between the first doped photodiode region and the second doped photodiode region is below a bottom surface of the first dielectric that faces the semiconductor substrate.

13. The image sensor integrated chip of claim 8, wherein the doped region has a smaller height directly above the photodiode than along the sidewalls of the semiconductor substrate forming the one or more trenches.

14. The image sensor integrated chip of claim 8, wherein a width of the second doped photodiode region is substantially constant between a first point at an interface between the first doped photodiode region and the second doped photodiode region and a second point below the interface.

15. The image sensor integrated chip of claim 8, wherein the doped region has a width that varies between a top of the photodiode and a bottom of the first dielectric.

16. The image sensor integrated chip of claim 8, wherein the doped region has a horizontally extending edge that is laterally outside of the photodiode, the first dielectric vertically extending from the first surface of the semiconductor substrate to below the horizontally extending edge.

17. The image sensor integrated chip of claim 8, wherein the doped region has a higher dopant concentration than a region of the semiconductor substrate that is laterally between the photodiode and the first dielectric.

18. An image sensor integrated chip, comprising:
a semiconductor substrate having sidewalls that form one or more trenches disposed along opposing sides of a photodiode;
a doped region arranged along an upper surface of the semiconductor substrate, wherein the doped region comprises a lower horizontally extending boundary that is laterally outside of the photodiode and an upper boundary above the photodiode;
a first dielectric lining the sidewalls and the upper surface of the semiconductor substrate, wherein a first vertical distance between a bottom of the first dielectric and the lower horizontally extending boundary of the doped region is greater than a second vertical distance between the lower horizontally extending boundary of the doped region and the upper boundary of the doped region;
a second dielectric lining sidewalls and an upper surface of the first dielectric;
a color filter disposed over an upper surface of the second dielectric; and
a micro-lens disposed over the color filter.

19. The image sensor integrated chip of claim 18, wherein the photodiode is disposed within a pixel region, wherein the upper boundary of the doped region continuously extends from over the photodiode to laterally past the opposing sides of the photodiode.

20. The image sensor integrated chip of claim 18, wherein the first dielectric laterally contacts the second dielectric vertically above a top of the doped region.

* * * * *